United States Patent [19]

Gregorian

[11] 4,210,872
[45] Jul. 1, 1980

[54] HIGH PASS SWITCHED CAPACITOR FILTER SECTION

[75] Inventor: Roubik Gregorian, Sunnyvale, Calif.

[73] Assignee: American Microsystems, Inc., Santa Clara, Calif.

[21] Appl. No.: 940,717

[22] Filed: Sep. 8, 1978

[51] Int. Cl.² ............................................. H03F 1/34
[52] U.S. Cl. ..................................... 330/9; 330/107; 330/109
[58] Field of Search ................ 330/9, 51, 69, 107, 330/109, 303

[56] References Cited

PUBLICATIONS

Delagrange–"FETs in RC Network Tune Active Filter"–Electronics–Dec. 1970, p. 76.

*Primary Examiner*—James B. Mullins
*Attorney, Agent, or Firm*—Owen, Wickersham & Erickson

[57] ABSTRACT

A high-pass switched capacitor biquadratic filter based on the bilinear z-transform. The filter comprises first and second integrating operational amplifiers connected in series and in combination with a third operational amplifier that serves as a sample and hold and also generates one simple pole and zero pair in the circuit transfer function thereby enabling the circuit to provide for a high degree of filter efficiency in a preselected frequency range. The operational amplifiers are connected to and operate in cooperation with capacitors of a predetermined size which are switched on and off continuously by two phase clock signals supplied to the circuit. The loss characteristic of the filter can be programmed by varying the clocking frequency. Higher order filters can be obtained by the tandem connection of second order circuit sections followed by one or more first order pole-zero section.

8 Claims, 7 Drawing Figures

FIG_1

FIG_2a

FIG_2b

FIG_2c

FIG_2d

FIG_3

FIG_4

HIGH PASS SWITCHED CAPACITOR FILTER SECTION

This invention relates to electronic filters for data transmission or communication systems and electronic control equipment and more particularly it relates to a sampled data high pass filter that can be implemented as an integrated circuit semiconductor device.

BACKGROUND OF THE INVENTION

The design of electronic data transmission systems requires adequate filters for frequency selective filtering. Such filters preferably implemented as integrated circuit devices must not only be compatible with other system components but they should utilize a minimum of silicon chip area, have a high dynamic range, provide gain in the passband and should have zeros of transmission at zero frequency in order to realize high pass filtering.

Prior to the present invention, filters were suggested using switched capacitors and operational amplifiers. The basic building block of such circuits was usually a sampled-data integrator, obtained by replacing the resistor in an R-C active integrator with a switched-capacitor resistor. This approach, however, presented certain problems because the mere replacement by switched capacitors does not simulate the equivalent resistors exactly. Distortion in the frequency response of such circuits occurred because of the imperfect mapping of the frequency variables when transformed from the s to the z plane. Circuits utilizing a grounded capacitor in conjunction with two switches to replace a resistor are discussed in *IEEE Journal of Solid State Circuits*, Vol. SC-12, No. 6, pp. 392–599 and pp. 600–608, Sec. 1977. For such circuits, the mapping between the frequency variables is given by the formula $s \rightarrow (z-1)/T$, which is equivalent to replacing derivatives in the differential equation of a continuous system with forward differences. In order to keep a close match between the performances of the continuous and discrete-time systems, the clock rate 1/T must be chosen much higher than the highest frequency present in the signal. In another prior technique, the switched capacitor that replaced the resistor had a special configuration based on the trapezoidal integration. Thus, it performed a conformal mapping from the s plane to the z plane and eliminated the disadvantages mentioned above. The resulting discrete-time response is related to that of the continuous-time model through the bilinear transformation defined by:

$$s \Longleftrightarrow \frac{2}{T} \cdot \frac{1-z^{-1}}{1-z^{-1}} . \quad \text{Equation (1)}$$

A significant disadvantage of this latter approach is that the difference of two signals or the negative of a signal cannot be obtained as easily as with the grounded switched-capacitor "resistor." In order to exploit this ease of design inherent in the grounded switched-capacitor circuit, and at the same time compensate for the s-to-z plane mapping defects, a direct z-domain synthesis should be carried out. The present invention describes a filter section that provides a solution to this problem.

Another problem which has been overcome by the present invention is that of providing a third order filter section that eliminates analog components in an output sample-and-hold sub-section.

BRIEF SUMMARY OF THE INVENTION

In accordance with the principles of the present invention a novel switched-capacitor circuit or biquadratic section (biquad) is provided, which is suitable for high-pass filters, based on direct z-domain synthesis.

In general, the filter circuit is comprised of a first pole-zero section having a capacitor between the negative input of an integrating operational amplifier and a switch means connected to the input source. When the switch means is closed or "on", the side of the capacitor connected to the operational amplifier is held at virtual ground while the other side or intermediate node is charged to the input signal. When the switch turns off, the intermediate node is held at that voltage at the next clock pulse or switch "on" cycle and it is charged to the next value of the input. The net charge of the voltage at that point is the difference of the input sample at the present time and the input sample at the previous time cycle.

The output of the first operational amplifier has two zeros and two complex conjugate poles in its transfer function because of feedback from a second operational amplifier. The output of the first operational amplifier is connected to a second and similar pole-zero section that includes a third operational amplifier controlled by switch means which is "on" during the $\phi$ phase. Thus, this second section is out of phase with the first section and operates to block the feed through of the undesirable analog components from the input source, while the third operational amplifier also generates one simple pole and zero pair in the circuit transfer to increase its filtering efficiency.

In brief, the objects of the invention are: to provide an improved switched-capacitor high pass filter; to provide such a high pass filter that is readily adaptable for implementation as an integrated circuit device with a minimum of chip area; to provide a filter with a high dynamic range and one that provides gain in the passband; to provide a high pass filter that yields frequency responses that have a low sensitivity to the filter coefficients; to provide a sampled-data filter of the third order that provides an output with no analog components from an analog input signal.

Other objects, advantages and features of the present invention will become apparent from the following detailed description which is presented in conjunction with the accompanying drawing:

DETAILED DESCRIPTION OF THE EMBODIMENT

Figure 1:
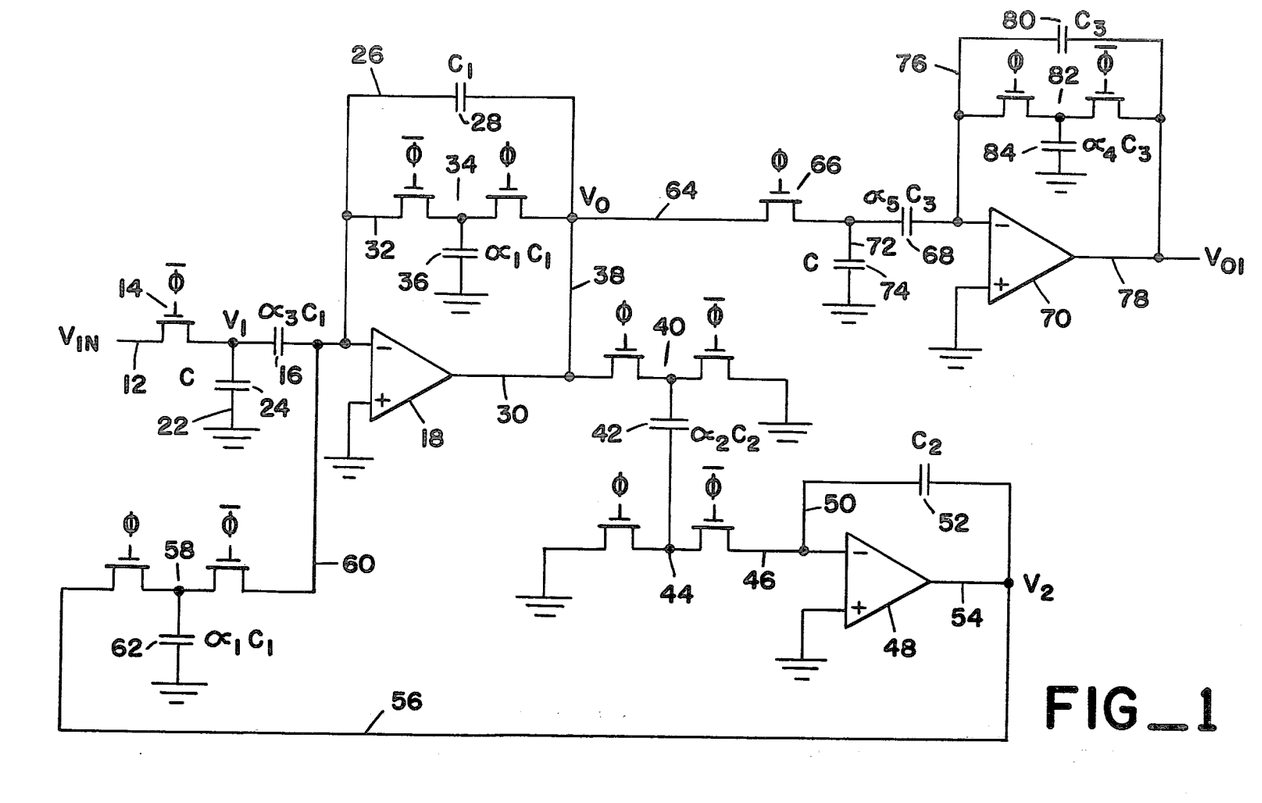
FIG. 1 is a circuit diagram of a filter section embodying the principles of the present invention.

With reference to the drawing, FIG. 1 represents a circuit diagram for a sampled-data, switched capacitor high-pass filter 10 according to the present invention. As used in a typical data transmission system the circuit is adapted to receive an input signal $V_{in}$ from a connected data source from which it is desired to filter out all frequencies below a preselected level, so that the circuit output $V_{out}$ is comprised only of the filter signal above the pass level.

As shown, the input $V_{in}$ is supplied via a lead 12, through a switch means 14, and through a capacitor 16 to the negative input of a first integrating operational amplifier 18. The plus terminal of the amplifier 18 is connected to ground.

The circuit 10 operates with alternating $\phi$ and $\bar{\phi}$ clock phases which are provided from a suitable clock generator (not shown) at a predetermined frequency (e.g. 128 kilo hertz).

The switch means 14, as shown, is preferably implemented as a MOSFET device whose gate is connected to the $\bar{\phi}$ clock phase.

In a lead 22 connected to the lead 12 at a node $V_1$ between the switch means 14 and the capacitor 16 is a capacitor 24 whose other side is connected to ground.

A bypass lead 26 connected to a capacitor 28 is also connected to the input lead 12 and to an output lead 30 from the operational amplifier 18. In parallel with the lead 26 and the capacitor 28 is a lead 32 connected to an alternating switch means 34 represented by a pair of MOSFET elements whose gates are connected to $\phi$ and $\bar{\phi}$ clock phases. A terminal between these elements is connected through a capacitor 36 to ground.

The output $V_o$ of the first operational amplifier 18 is connected by a lead 38 to the lead 32 and is also supplied via lead 30 to an alternating switch means 40 comprised of another pair of MOSFET devices whose gates are connected to the $\phi$ and $\bar{\phi}$ clock phases. A terminal between these latter switch elements is connected through a capacitor 42 to the terminal of another switch means 44 comprised of another pair of MOSFET devices whose gates are also connected to the $\phi$ and $\bar{\phi}$ clock phases. The $\bar{\phi}$ phase MOSFET of switch means 40 is connected to ground, as is the $\phi$ phase MOSFET of switch means 44.

The $\bar{\phi}$ phase MOSFET of switch means 44 is connected via a lead 46 to the negative input of a second operational amplifier 48 whose positive terminal is connected to ground. A bypass lead 50 to an output lead 54 from the operational amplifier 48 which provides an output $V_2$.

A feedback lead 56 is also connected from the output of the second operational amplifier to the $\phi$ phase MOSFET of an alternating switch means 58 whose other $\bar{\phi}$ phase MOSFET is connected by a lead 60 to the input lead 12 for the first operational amplifier 18. A terminal between the pair of MOSFETS of the switch means 58 is connected to one side of a capacitor 62 whose other side is connected to ground.

Connected to the lead 36 from the output of the first operational amplifier 18 is a lead 64 connected to one contact of a switch means 66 in the form of a MOSFET whose gate is connected to the $\phi$ clock phase. The other side of this switch means is connected to one side of a capacitor 68 whose other side is connected to the negative input of a third operational amplifier 70 having its positive terminal connected to ground. A lead 72, connected to the lead 64 between the switch means 66 and the capacitor 68 is also connected through a capacitor 74 to ground. A bypass lead 76 for the operational amplifier 70 is connected between its input lead 64 and its output lead 78 through a capacitor 80. In parallel with this capacitor is a feedback loop comprising an alternating switch means 82 comprised of a pair of MOSFET elements whose gates are connected to $\phi$ and $\bar{\phi}$ clock phases. A terminal between these two MOSFETS is connected through a capacitor 84 to ground.

The three operational amplifiers 18, 48 and 70 are also preferably implemented with MOS elements in a suitable circuit configuration connected to $V_{SS}$ and $V_{DD}$ voltage sources. A particular operational amplifier circuit is not shown in detail since a suitable one can be readily selected by one skilled in the art.

In the operation of the filter circuit 10, the two-phase non-overlapping clock is constantly supplying pulses at the preselected sampling frequency $f_c = 1/T$ (e.g. 128 Kilo Hertz). At time $(n-1)T$, when clock $\phi$ is "on," the voltages at nodes $V_1$, $V_0$, and $V_2$ are held at $V_{in}(n-1)$, $V_0(n-1)$ and $V_2(n-1)$, respectively. At the end of the $\phi$ "on" period, capacitors 36 ($\alpha_1 C_1$) and 42 ($\alpha_2 C_2$) are charged to $V_0(n-1)$, the output voltage of the first operational amplifier. The capacitor 58 ($\alpha_1' C_1$) connected to the output of the second operational amplifier 48, is charged to the level $V_2(n-1)$. When $\phi$ phase turns "off" and $\bar{\phi}$ phase turns "on," the capacitor 24 (C) charges up to $V_{in}(n)$ and the following charge conservation equation is valid for operational amplifier 18:

$$C_1 v_0(n) = C_1 v_0(n-1) - \alpha_1' C_1 v_0(n-1) - \alpha_1 C_1 v_2(n-1) - \alpha_3 C_1 [v_{in}(n) - v_{in}(n-1)] \quad \text{Equation (2)}$$

Taking the z-transforms of both sides of Eq. (4) and assuming $\alpha_1' = \alpha_1$ yields $$V_0(z) = (1 - \alpha_1) z^{-1} V_0(z) - \alpha_1 z^{-1} V_2(z) - \alpha_3 V_{in}(z)(1 - z^{-1}) \quad \text{Equation (3)}$$

or $$V_0(z) = \frac{-\alpha_1 V_2(z) - \alpha_3 V_{in}(z)(z-1)}{z - (1 - \alpha_1)}$$

Constructing a similar charge-conservation equation for operational amplifier 2 and keeping in mind that $\alpha_2 C_2$ is an inverting switched capacitor we have $$V_2(z) = z V_0(z)/z - 1 \quad \text{Equation (4)}$$

Combining Eqs. (5) and (6) we obtain $$H_2(z) \triangleq \frac{V_2(z)}{V_{in}(z)} = \frac{-\alpha_2 \alpha_3 (z-1)}{z^2 - z(2 - \alpha_1) + 1 - \alpha_1 + \alpha_1 \alpha_2} \quad \text{Equation (5)}$$

and the overall transfer function $$H_0(z) \triangleq \frac{V_0(z)}{V_{in}(z)} = \frac{-\alpha_3(z-1)}{z^2 - z(2 - \alpha_1) + 1 - \alpha_1 + \alpha_1 \alpha_2} \quad \text{Equation (6)}$$

Eq. (6) is the transfer function of a high-pass filter with two complex conjugate poles and two simple zeros at DC ($z = 1$).

Figure 2A:
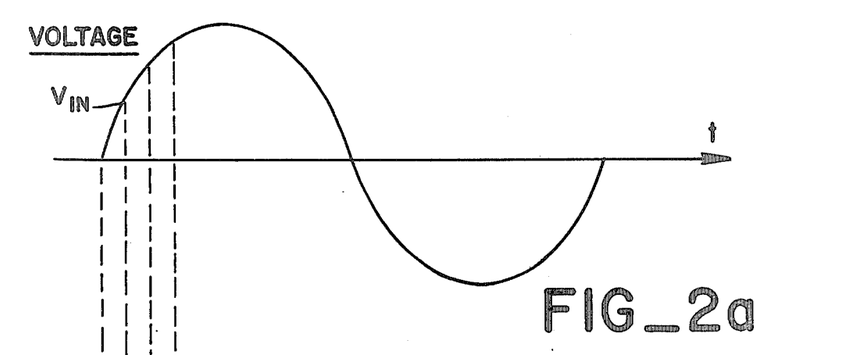
FIG. 2a is a wave form of the voltage input $V_{in}$.
Figure 2B:
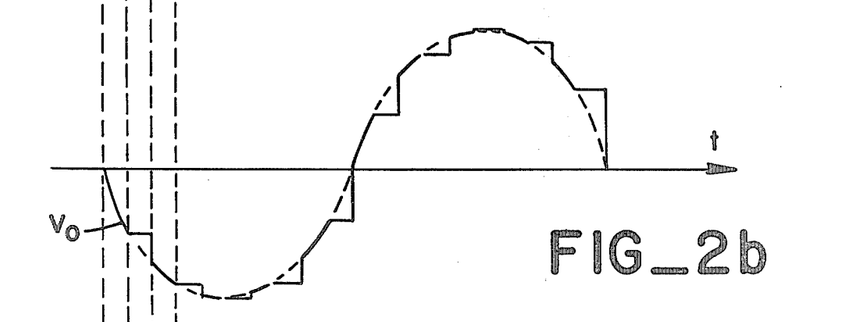
FIG. 2b is a wave form of the voltage output ($V_o$) from the first operational amplifier.
Figures 2C, 2D:
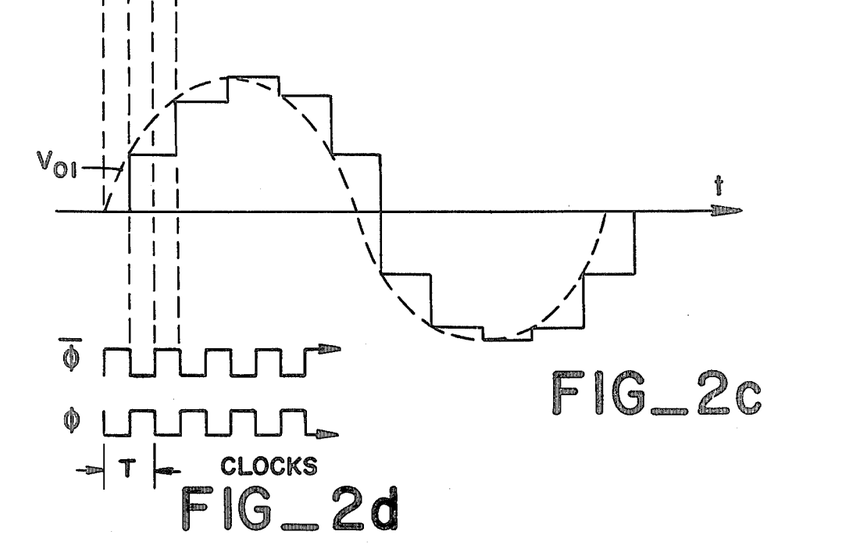
FIG. 2c is a wave form of the voltage output ($V_o$) from the third operational amplifier.
FIG. 2d is a wave form of the clock signals for the circuit.

If the filter circuit 10 did not have the sub-section with the third operational amplifier 70 and the capacitors 68 and 74, it would have a major problem. During the period when $\phi$ is "on" and capacitor 16 ($\alpha3C_1$) is connected to $V_{in}$, there is an undesirable direct feedthrough from $V_{in}$ to the output voltage $V_0$. Therefore, the output of the first operational amplifier 18 is not a sampled and held signal. The voltage $V_0$ consists of two components—a discrete-time signal governed by the transfer function (Eq. 6) and an unwanted analog output signal given by $-\alpha_3 V_{in}$, which occurs during the period when $\phi$ is "on." This is illustrated in the drawing, wherein FIG. 2a depicts an analog input signal $V_{in}$; FIG. 2b depicts the output $V_0$ having analog components on alternate clock phases; FIG. 2c depicts the output $V_{01}$ without the analog components; and FIG. 2d shows the corresponding clock signals for the wave forms.

The elimination of the analog signal components is accomplished in the circuit 10 by blocking them with the output sample and hold section comprising the third operational amplifier 70 which is clocked out of phase with the original filter section comprised of the first and second operational amplifier. Thus, the output section is controlled by the MOSFET switch 66 which is closed during phase $\bar{\phi}$. During this phase $\bar{\phi}$ "on" condition, the output $V_0$ of operational amplifier 18 is held constant because $\phi$ phase is off. Therefore, when $\bar{\phi}$ is "on" and the output of the first operational amplifier is varying with the input $V_{in}$, that signal is blocked by switch 66 and is not transferred. But when $\bar{\phi}$ goes "off" and $\phi$ goes "on," the input signal is fed directly from capacitor 16 ($\alpha_3c_1$) through capacitor 28 ($c_1$) and the output at node $V_0$ is constant and the capacitor 68 ($\alpha_5C_3$) is charged.

In addition to its analog component blocking function as described, the third operational amplifier also serves to operate one additional pole-and-zero pair so that a third order filter is provided. Using the charge-conservation equation, the relationship between the z-transforms of $v_{01}$ and $v_0$ is given by $$V_{o1}(z) = \frac{-\alpha_5(z-1)}{z-(1-\alpha_4)} V_0(z) \qquad \text{Equation (7)}$$

Combining Eqs. (6b) and (7), we get $$H_{01}(z) \triangleq \frac{V_{01}(z)}{V_{in}(z)} = \qquad \text{Equation (8)}$$

$$\frac{\alpha_3\alpha_5(z-1)^3}{[z-(1-\alpha_4)][z^2-z(2-\alpha_1)+1-\alpha_1+\alpha_1\alpha_2]}$$

which is the transfer function of a third-order high-pass filter.

In the actual design of a filter using the principle of the invention, the conformal mapping from the s-plane to the z-plane is the bilinear transformation defined by Eq. (1). Since the entire $j\Omega$ axis of the s-plane is mapped onto the unit circle in the z-plane, the aliasing error inherent in other design methods using an analog model is eliminated. However, there is a nonlinear relationship between the analog frequency $\Omega$ and the discrete-time frequency $\omega$ given by $$\Omega \rightarrow 2/T \tan \omega T/2. \qquad \text{Equation (9)}$$

Fortunately, for a "brick-wall" type loss characteristic filter, one can compensate for the frequency warping.

Figure 3:
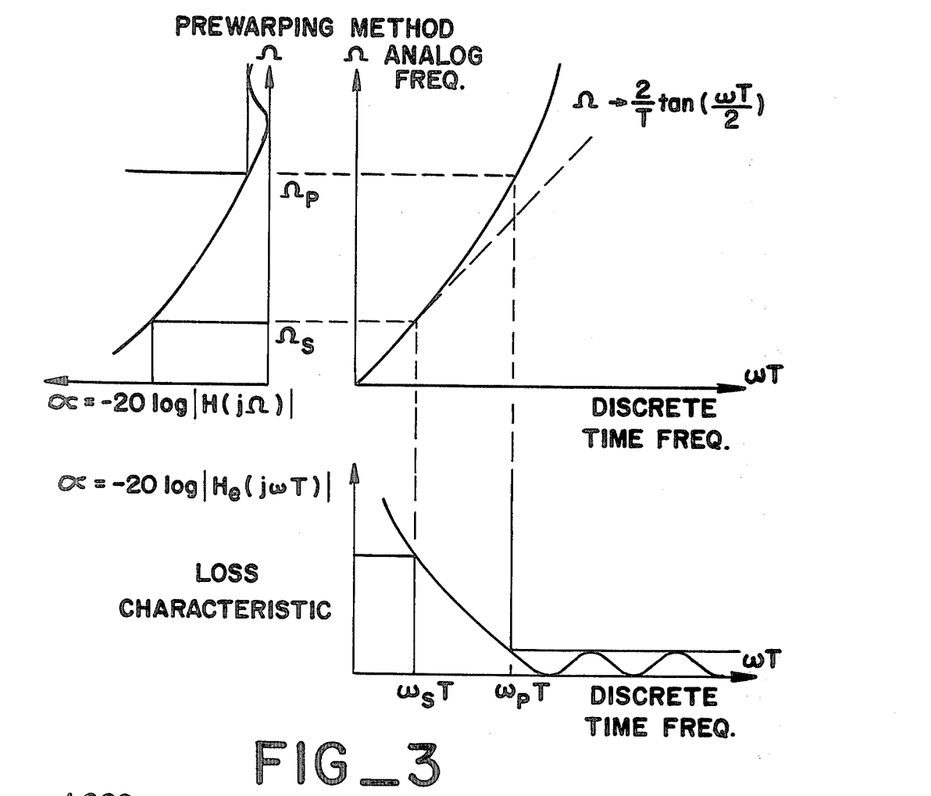
FIG. 3 shows a diagram illustrating a method for prewarping the loss characteristic to compensate for non-linear frequency warping.

The compensation process used for a high-pass filter is illustrated in FIG. 3. Once the loss characteristic of the prewarped filter is determined (upper left of FIG. 3), an analog filter is designed to meet the transformed loss characteristic. The transfer function of the digital filter $H(z)$ is then obtained by making the algebraic substitution of Eq. (1); i.e., $$H(z) = H(s)|_{s=(2/T)[1-z^{-1})/(1+z^{-1})]} \qquad \text{Equation (10)}$$

In summary, the design of the high pass filter can be performed in the following steps:

1. The specified passband and stopband frequencies $\omega_p$ and $\omega_s$ are translated into the corresponding values $\Omega_p$ and $\Omega_s$ using the relation $\Omega = (2/T) \tan(\omega T/2)$.
2. An analog filter is designed from the transformed band-limit frequencies.
3. The z domain transfer function is obtained by applying the following transformation:

$$s \rightarrow 2/T \, z - 1/z + 1$$

to the s domain transfer function.

4. The capacitor ratios $\alpha_1$, $\alpha_2$, $\alpha_3$, $\alpha_4$, and $\alpha_5$ are obtained by equating the corresponding coefficients of the "z" power in equation 8 and the derived transfer function.

The foregoing procedure may be illustrated by assuming the design of a particular high-pass switched-capacitor filter satisfying preselected loss specifications using a typical sampling rate (e.g. 16 kHz). These specifications are indicated by the shaded areas in FIG. 4.

Figure 4:
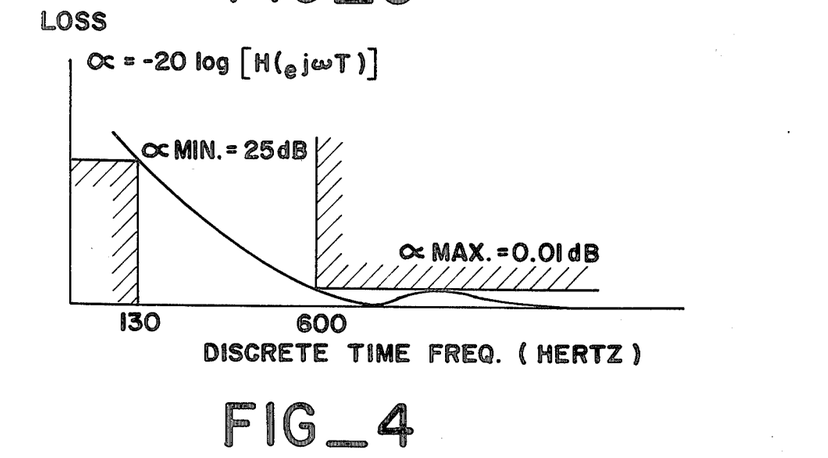
FIG. 4 is a diagram of the loss response for a typical filter according to the present invention.

For a third-order high-pass analog filter function designed to meet the loss specifications of FIG. 4 by applying a frequency transformation to a low-pass prototype function, the resulting high-pass transfer function is given by:

$$H(s) = \frac{5.207s^3}{(A + 1.59s)(A^2 + 1.59As + 3.28s^2)} \qquad \text{Equation (11)}$$

where $A = 1200\pi$. Then, H(z) is obtained using the bilinear transformation which here becomes:

$$s \rightarrow (32000)z - 1/z + 1.$$

This gives:

$$H(z) = \frac{0.877(z-1)^3}{(z-0.862)(z^2 - 1.876z + 0.892)} \qquad \text{Equation (12)}$$

By equating the coefficients of the corresponding degrees of z in Eqs. (12) and (8) and solving for the unknown $\alpha_1$, the following capacitor ratios are obtained:

$\alpha_1 = 0.124$
$\alpha_2 = 0.129$
$\alpha_{3,5} = 0.877$
$\alpha_4 = 0.138$

The actual resulting loss characteristic of the resulting filter of this example is shown by the curved line in FIG. 4.

From the foregoing, it should be apparent that the present invention provides a third-order high-pass switched-capacitor filter section having significant performance advantages. In production, it is readily adaptable for implementation as an integrated circuit device, and a design technique is provided for obtaining the element values of the filter. Since the design is based on the bilinear z-transform, it does not cause any distortion that is inherent in some other design methods based on an analog model. Also, since the design is carried out in the z-domain, the resulting loss can be programmed by varying the clocking frequency. Higher-order filters can be obtained by the tandem connection of second-order sections followed by one or more first-order pole-zero sections. The filter is immune to DC offset signals present at the input, and the internal DC offsets are not amplified so much as to cause dynamic range problems.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A high-pass sampled-data filter comprising
   a first integrating operational amplifier;
   input means connected to said first operational amplifier for supplying a continuous signal voltage to be filtered, said input means having a first switch means adapted to be connected with and controlled by a first phase of a continuous two-phase alternating clock generator, a first switched capacitor connected to ground and to said input means, and a first gain multiplying capacitor in said input means between said storage capacitor and the input to said first operational amplifier;
   a bypass lead connected between the input and output of said first operational amplifier for providing a feedback thereto and containing an alternating second switch means connected to said second clock generator with a second switched capacitor connected to ground and to said switch means so that it is charged during a second clock phase and discharged as a feedback during each first clock phase;
   a second integrating operational amplifier;
   means for connecting the output of said first operational amplifier to an input of said second operational amplifier including a third switched capacitor and third switch means connected to said clock generator so that said third switched capacitor is charged during each said second clock phase and is discharged to said second operational amplifier during each said first clock phase;
   feedback means connecting the output of said second operational amplifier to said input means of said first operational amplifier including a fourth switch means connected to said clock generator, a fourth switched capacitor connected between said fourth switch means and ground, said fourth switch means being connected so that the output of said second operational amplifier is fed back to charge said fourth switched capacitor during each second clock phase and said capacitor is discharged during each first clock phase;
   a third integrating operational amplifier;
   conductive means for connecting the output of the first operational amplifier to an input terminal of said third operational amplifier including a fifth switch means connected to the second clock phase of said clock generator, a fifth switched capacitor connected to said conductive means and a second gain amplifying capacitor between the fifth switch means and said input terminal;
   feedback means connected between the input and output of said third operational amplifier including a sixth switched capacitor and a sixth switch means connected thereto and to said clock generator so that said sixth capacitor is charged during each first phase clock cycle and is discharged to feedback during each second phase clock cycle.

2. The filter as described in claim 1 wherein all of said switch means comprise MOSFET devices whose gates are connected to either $\phi$ or $\bar{\phi}$ phase of said clock generator.

3. The filter as described in claim 1 wherein all of said switched capacitors have preselected values in related ratios to each other in order to provide a filter with predetermined characteristics.

4. The filter as described in claim 1 wherein said filter is a third order filter whose transfer function in the "z" domain is expressed as:

$$H_{01}(z) = \frac{\alpha_3\alpha_5(z-1)^3}{[z-(1-\alpha_4)][z^2-z(2-\alpha_1)+1-\alpha_1+\alpha_1\alpha_2]}$$

wherein $\alpha_1, \alpha_2, \alpha_3$, and $\alpha+$ are preselected ratio factors for said capacitors in the circuit and: $C_1$, $C_2$ and $C_3$ are values for the integrating capacitors for said first, second and third operational amplifiers; said first and second gain multiplying capacitors having values of $\alpha_3 C_1$ and $\alpha_5 C_3$, respectively, said first and fifth switched capacitor having a value of C, said second and fourth switched capacitors having a value of $\alpha_1 C_1$, and said third switched capacitor having a value of $\alpha_2 C_2$.

5. A sampled-data high pass filter comprising
   a first operational amplifier having its own feedback loop;
   input means to said first operational amplifier;
   a second operational amplifier, means connecting the output of said first operational amplifier to the input of said second operational amplifier;
   means for providing a feedback loop from the output of said second operational amplifier to said input means of said first operational amplifier;
   a third operational amplifier having its own feedback loop;
   means connecting the output of the first operational amplifier to the input of said third operational amplifier;
   a plurality of switched capacitors in said feedback loops and said connection means;
   switch means operated by a continuous two-phase clock generator for controlling the charging and discharging of said switched capacitors so that said filter produces a predetermined filter characteristic with a third order transfer function.

6. The filter as described in claim 5 wherein said second operational amplifier is an integrator for integrating the output of said first operational amplifier before feeding it back to the input of said first operational amplifier.

7. The filter as described in claim 5 including means for clocking said input means to said first operational amplifier and said output from said first operational amplifier to said third operational amplifier at different clock phases so that the analog feed through from said input to the output of said first operational amplifier is blocked.

8. The filter as described in claim 5 wherein said third operational amplifier provides an additional pole-zero section to the transfer function of said filter, thereby making it a third order filter.

* * * * *

UNITED STATES PATENT AND TRADEMARK OFFICE
CERTIFICATE OF CORRECTION

PATENT NO. : 4,210,872
DATED : July 1, 1980
INVENTOR(S) : Roubik Gregorian

It is certified that error appears in the above—identified patent and that said Letters Patent is hereby corrected as shown below:

Column 4, line 35, delete the entire line, and substitute
-- $C_1 V_o(n) = C_1 V_o(n-1) - \alpha_1' C_1 V_o(n-1) - \alpha_1 C_1 V_2(n-1)$ --;

Column 4, line 36, delete ")$-\alpha_3 C_1 [V_{in}(n) - V_{in}(n-1)$", and substitute -- $-\alpha_3 C_1 [V_{in}(n) - V_{in}(n-1)]$ --;

Column 4, line 40, delete entire line and substitute
-- $V_o(Z) = (1-\alpha_1) Z^{-1} V_o(Z) - \alpha_1 Z^{-1} V_2(Z) -$ --;

Column 4, line 41, delete entire line and substitute
-- $\alpha_3 V_{in}(Z)(1-Z^{-1})$ --;

Column 4, line 63, delete "$-\alpha_3(Z-1)$", and substitute
-- $-\alpha_3(Z-1)^2$ --;

Column 5, line 4, delete "$\phi$", and substitute -- $\bar{\phi}$ --;

UNITED STATES PATENT AND TRADEMARK OFFICE
CERTIFICATE OF CORRECTION

PATENT NO. : 4,210,872
DATED : July 1, 1980
INVENTOR(S) : Roubik Gregorian

It is certified that error appears in the above—identified patent and that said Letters Patent is hereby corrected as shown below:

Column 6, line 21, delete "2→2/TZ-1/Z+1", and substitute -- $s \rightarrow \frac{2}{T} \frac{(Z-1)}{(Z+1)}$ --;

Column 7, line 34, delete "second" as in "second clock generator", continuing onto line 35.

Column 7, line 36, add --second-- between the words "said" and "switch".

Signed and Sealed this

Tenth Day of February 1981

[SEAL]

Attest:

RENE D. TEGTMEYER

Attesting Officer

Acting Commissioner of Patents and Trademarks

UNITED STATES PATENT AND TRADEMARK OFFICE
CERTIFICATE OF CORRECTION

PATENT NO. : 4,210,872
DATED : July 1, 1980
INVENTOR(S) : Roubik Gregorian

It is certified that error appears in the above—identified patent and that said Letters Patent is hereby corrected as shown below:

Column 1, line 55, delete equation 1 and substitute $$-- s \longleftrightarrow \frac{2}{T} \frac{1-z^{-1}}{1+z^{-1}} --;$$

Signed and Sealed this

Seventeenth Day of March 1981

[SEAL]

Attest:

RENE D. TEGTMEYER

*Attesting Officer*     *Acting Commissioner of Patents and Trademarks*